United States Patent
Hurwitz et al.

(10) Patent No.: US 8,956,949 B2
(45) Date of Patent: Feb. 17, 2015

(54) ELECTRICAL SIGNAL ISOLATION IN SEMICONDUCTOR STRUCTURES

(71) Applicant: Newport Fab, LLC, Newport Beach, CA (US)

(72) Inventors: Paul D. Hurwitz, Irvine, CA (US); Robert L. Zwingman, Walnut, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/465,766

(22) Filed: Aug. 21, 2014

(65) Prior Publication Data

US 2014/0363949 A1 Dec. 11, 2014

Related U.S. Application Data

(62) Division of application No. 13/570,107, filed on Aug. 8, 2012, now Pat. No. 8,816,471.

(60) Provisional application No. 61/586,285, filed on Jan. 13, 2012.

(51) Int. Cl.
*H01L 21/322* (2006.01)
*H01L 21/762* (2006.01)

(52) U.S. Cl.
CPC ............... *H01L 21/76283* (2013.01)
USPC ...... 438/422; 438/421; 257/522; 257/E21.32; 257/E21.573; 257/E21.546

(58) Field of Classification Search
USPC .......... 438/422, 421; 257/522, E21.573, 257/E21.546, E21.32
See application file for complete search history.

(56) References Cited

U.S. PATENT DOCUMENTS

| | | | |
|---|---|---|---|
| 6,235,643 B1 | 5/2001 | Mui | |
| 6,432,799 B1 * | 8/2002 | Hashimoto et al. | 438/435 |
| 2005/0148153 A1 | 7/2005 | Takahashi | |
| 2006/0263991 A1 * | 11/2006 | Lee et al. | 438/296 |
| 2007/0235783 A9 * | 10/2007 | Sandhu et al. | 257/296 |
| 2009/0230508 A1 | 9/2009 | Dyer | |
| 2010/0025584 A1 * | 2/2010 | Sasaki et al. | 250/338.4 |
| 2010/0032796 A1 * | 2/2010 | Brown et al. | 257/510 |
| 2010/0035403 A1 * | 2/2010 | Brown et al. | 438/422 |
| 2012/0038024 A1 * | 2/2012 | Botula et al. | 257/510 |
| 2012/0104511 A1 * | 5/2012 | Chan et al. | 257/369 |

* cited by examiner

*Primary Examiner* — Victor A Mandala
(74) *Attorney, Agent, or Firm* — Farjami & Farjami LLP

(57) ABSTRACT

Disclosed are a structure for electrical signal isolation between adjacent devices situated in a top semiconductor layer of the structure and an associated method for the structure's fabrication. The structure includes a trench extending through the top semiconductor layer and into a base oxide layer below the top semiconductor layer. A handle wafer is situated below the base oxide layer and a void is disposed in the handle wafer below the trench. A bottom opening of the trench connects the main body of the trench with the void forming a continuous cavity including the main body, the bottom opening of the trench, and the void such that the void improves electrical signal isolation between the adjacent devices situated in the top semiconductor layer. Unetched portions of the handle wafer are then available to provide mechanical support to the top semiconductor layer.

20 Claims, 7 Drawing Sheets

US 8,956,949 B2

ELECTRICAL SIGNAL ISOLATION IN SEMICONDUCTOR STRUCTURES

This is a divisional of application Ser. No. 13/570,107 filed Aug. 8, 2012.

BACKGROUND

The present application claims the benefit of and priority to a pending provisional patent application entitled "Electrical Signal Isolation and Linearity in SOI Structures," Ser. No. 61/586,285 filed on Jan. 13, 2012. The disclosure in that pending provisional application is hereby incorporated fully by reference into the present application.

Silicon on insulator (SOI) applications are commonly utilized where a high degree of noise isolation or low signal loss is required. In such SOI applications, a conducting inversion layer is typically present at the interface between a base oxide and a high resistivity handle wafer. Resistivity requirements imposed by active devices within SOI. applications also typically require a top silicon layer having a much lower resistivity than the high resistivity handler wafer. The combination of a low resistivity top silicon layer and an inversion layer at the base oxide-handle wafer interface results in a lossy, non-linear network that degrades isolation and linearity of SOI applications at high frequencies and power levels.

SOI applications have also employed annular isolation trenches in an attempt to reduce RF noise and increase isolation. However, such annular isolation trenches typically provide insufficient mechanical support around the circumference of the active areas being isolated, resulting in SOI substrates that are more prone to collapse.

SUMMARY

The present disclosure is directed to electrical signal isolation and linearity in SOI structures, substantially as shown in and/or described in connection with at least one of the figures, and as set forth more completely in the claims.

DETAILED DESCRIPTION

Figure 1:
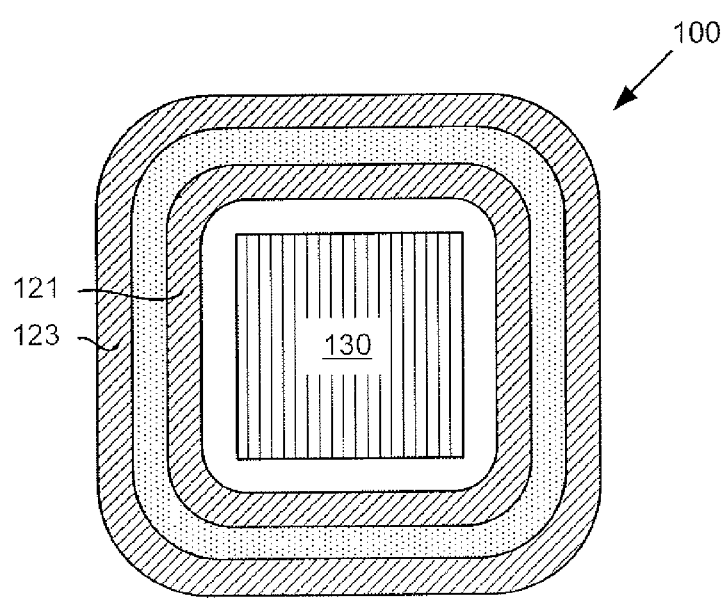
FIG. 1 illustrates an exemplary top view of a conventional structure for electrical signal isolation and linearity utilizing annular isolation trenches.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary top view of conventional structure 100 for electrical isolation of active area 130 by way of annular isolation regions 121 and 123. Specifically, conventional structure 100 utilizes first annular isolation trench 121 surrounding active area 130, which may be a large FET for example, requiring isolation. First annular isolation trench 121 may be surrounded by second annular isolation trench 123. However, because first and second annular isolation trenches 121 and 123, respectively, extend around a complete circumference of active area 130, the region underlying active area 130 as well as region 125 between first and second annular isolation trenches 121 and 122, respectively, are prone to collapse due to insufficient mechanical support.

Figure 2A:
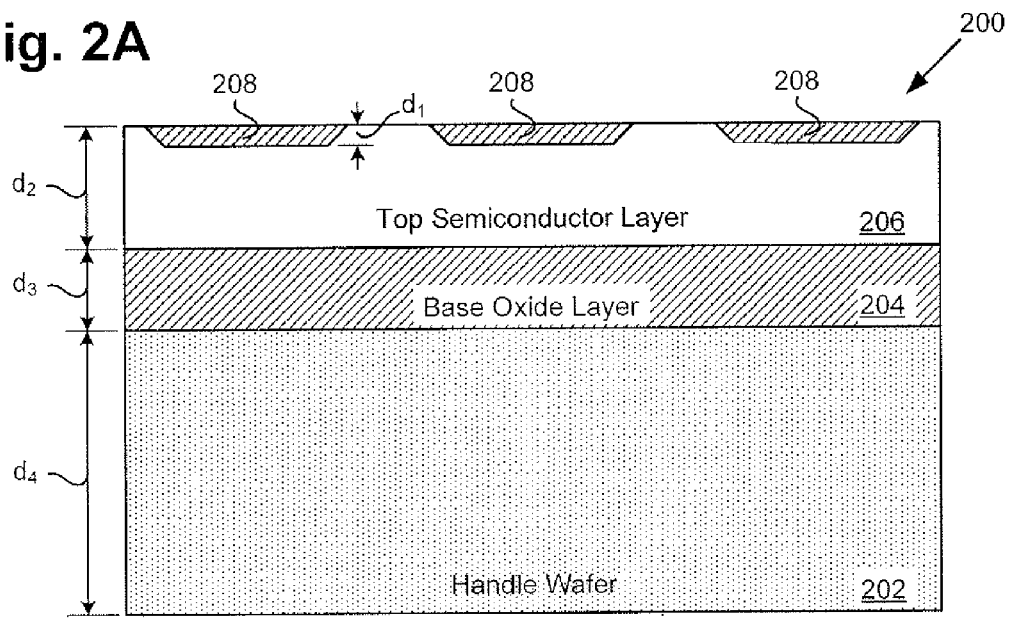
FIG. 2A illustrates an exemplary cross-sectional view of an SOI structure during fabrication in accordance with one implementation of the present application.
Figure 2B:
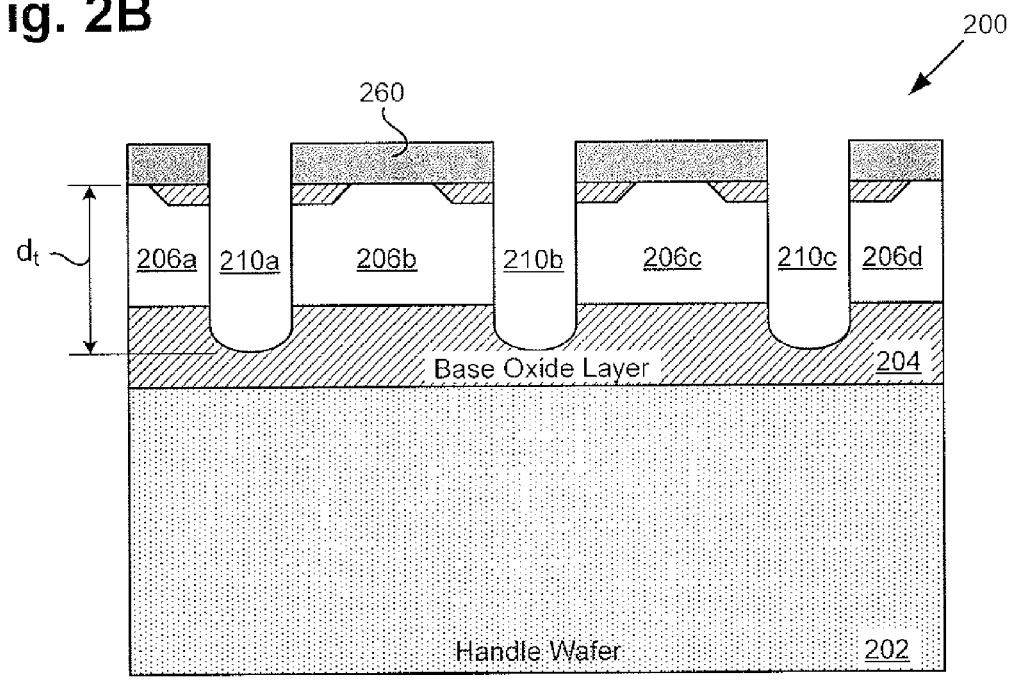
FIG. 2B illustrates an exemplary cross-sectional view of an SOI structure during fabrication in accordance with one implementation of the present application.
Figure 2C:
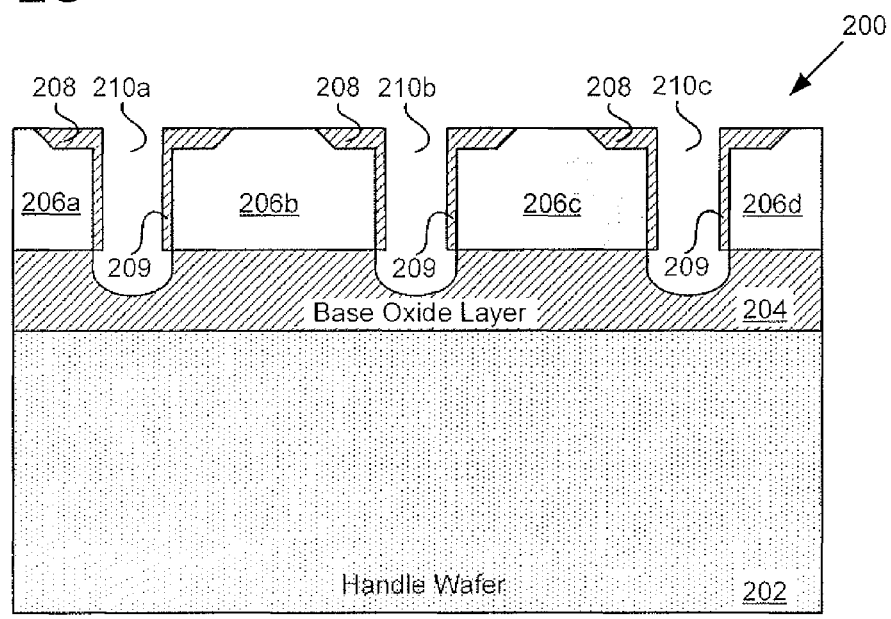
FIG. 2C illustrates an exemplary cross-sectional view of an SOI structure during fabrication in accordance with one implementation of the present application.
Figure 2D:
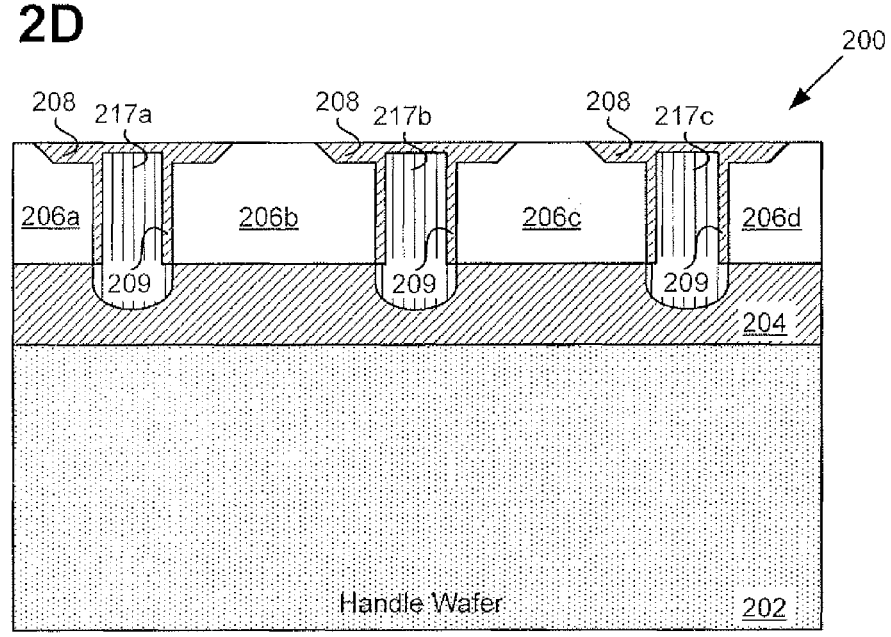
FIG. 2D illustrates an exemplary cross-sectional view of an SOI structure during fabrication in accordance with one implementation of the present application.
Figure 2E:
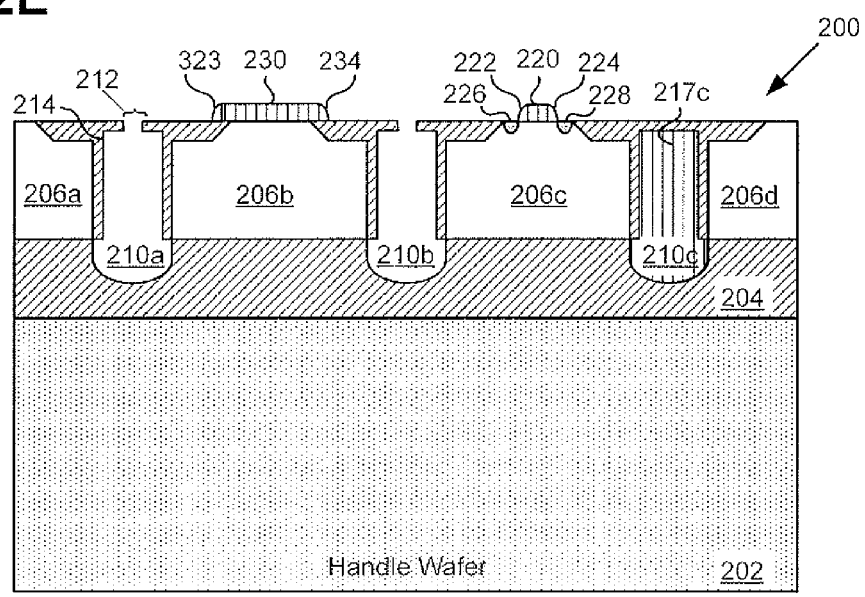
FIG. 2E illustrates an exemplary cross-sectional view of an SOI structure during fabrication in accordance with one implementation of the present application.

The fabrication of an SOI structure for improving electrical signal isolation and linearity will now be described with reference to FIGS. 2A-2H and FIG. 3. FIGS. 2A-2H illustrate exemplary progressive cross-sectional views of a structure for improving electrical signal isolation and linearity in SOI applications during fabrication. FIG. 3 shows an exemplary flowchart presenting actions taken to implement a method of fabricating a structure for improving electrical signal isolation and linearity in SOI applications FIG. 2A shows a starting wafer after application of an active device isolation process commonly used in CMOS technology. Specifically, SOI structure 200 may include top semiconductor layer 206 disposed over base oxide layer 204, and base oxide layer 204 disposed over handle wafer 202. Shallow field oxide layers 208 may be disposed in a top surface of top semiconductor layer 206, for example, to provide isolation structures between adjacent active regions of top semiconductor layer 204. Field oxide layers 208 may have thickness $d_1$ of 0.3 µm, for example. Top semiconductor layer 206 may comprise silicon, for example, and have thickness $d_2$ of between 1.5 µm and 2 µm, for example. And base oxide layer 204 and handle wafer 202 may have thicknesses $d_3$ and $d_4$, respectively, of 1 µm and up to 725 µm, respectively, for example. However, all these thicknesses may be greater than or less than the above-recited exemplary thicknesses depending on the particular requirements of the application.

Referring now to flowchart 300 of FIG. 3, action 310 includes etching a trench through the top semiconductor layer and partially into a base oxide layer below the top semiconductor layer. FIG. 2B, for example, illustrates such an action applied to SOI structure 200 where photoresist mask 260 may be defined using standard photolithography processing and used to etch a plurality of trenches 210a-c. Each of trenches 210a-c may be etched through field oxide layer 208 and top semiconductor layer 206, and partially into base oxide layer 204. The etch is preferably an anisotropic etch, such as a dry reactive ion etch for example, and may be performed to a depth $d_t$ of between 1 µm and 1.5 µm. However, the trench depth $d_t$ may be greater than or less than this range so long as the trenches extend partially into base oxide layer 204. Each trench 210a-c may have substantially the same trench width.

Continuing with flowchart 300, action 320 includes applying a high temperature oxidation to grow a liner oxide on the trench sidewalls. FIG. 2C, for example, illustrates such an action applied to SOI structure 200 where liner oxide 209 may be grown on the sidewalls of each trench 210a-c to a thickness of approximately 250 Angstroms (Å), for example, by way of a high temperature oxidation. Liner oxide 209 acts to protect top semiconductor layers 206a-d adjacent to the trenches' sidewalls, during a subsequent isotropic etch.

Action 330 of flowchart 300 includes depositing a polysilicon filler into the trench. Following action 330, action 340 includes applying another high temperature oxidation to cover the polysilicon filler with an oxide layer. FIG. 2D, for example, illustrates such actions applied to SOI structure 200 where polysilicon fillers 217a-c may be deposited into trenches 210a-c, respectively. A mechanical polish or planarization may then be applied to remove any excess polysilicon. Following the mechanical polish or planarization, and according to action 340, another high temperature oxidation may be performed to grow an oxide layer over the top of trenches 210a-c.

Standard CMOS processing, such as well and gate formation for example, may now be applied to SOI structure 200. For example, one or more active areas may be formed adjacent to one another within, or on, top semiconductor layer 206a-d. FIG. 2E, for example, illustrates such CMOS processing applied to SOI structure 200. For example, gate 220 having oxide spacers 222 and 224, source region 226 and drain region 228, as well as perpendicularly oriented gate 230 having oxide spacers 232 and 234. Deposition of a hardmask (not shown) for a subsequent handle wafer removal etch may follow. The hardmask may be patterned to define narrow openings 212 over a selection of the polysilicon-filled trenches, for example, trenches 210a and 210b.

Continuing with action 350 of flowchart 300, action 350 includes removing the polysilicon filler and subsequently etching through the base oxide layer to an underlying handle wafer. FIG. 2E, for example, illustrates the removal of the polysilicon filler portion of action 350 as applied to 801 structure 200 where a dry etch may be used to selectively remove polysilicon fillers 217a and 217b within trenches 210a and 210b, respectively. Existing methods such as a $Cl_2$-HBr based dry etch, for example, may be used to easily obtain etch selectivity of greater than 50:1, removing polysilicon fillers 217a and 217b while removing almost none of the hardmask (not shown) or liner oxide 209.

Figure 2F:
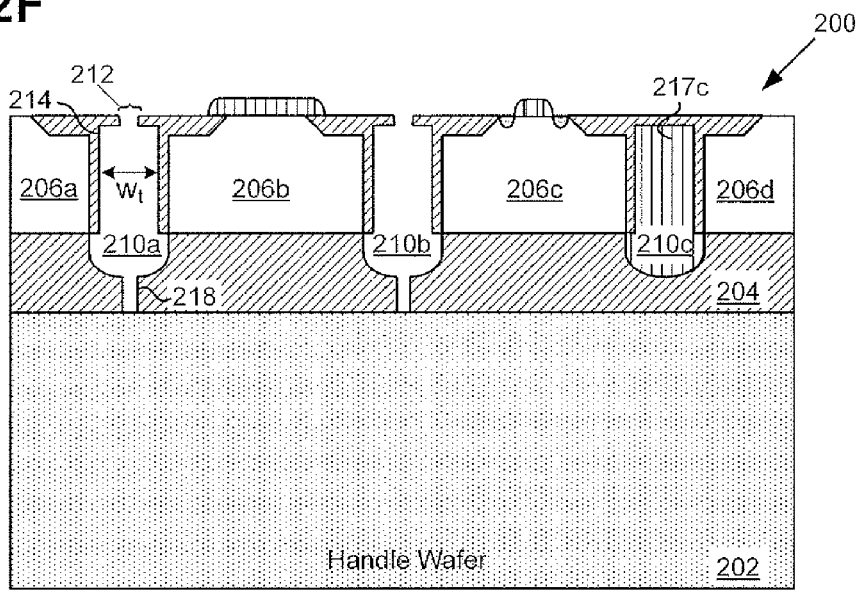
FIG. 2F illustrates an exemplary cross-sectional view of an SOI structure during fabrication in accordance with one implementation of the present application.
Figure 3:
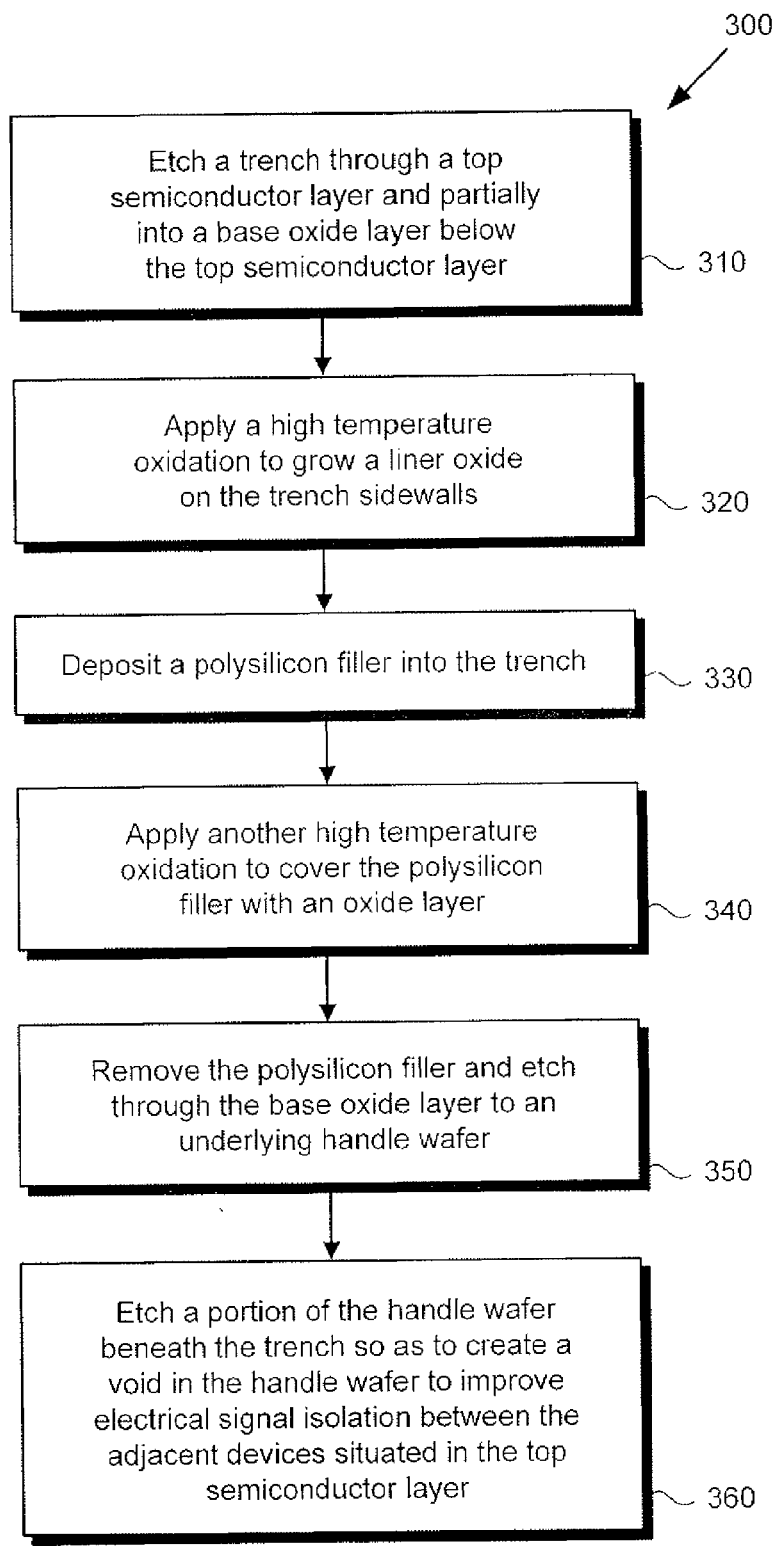
FIG. 3 presents an exemplary flowchart illustrating a method for fabricating an SOI structure for improving electrical signal isolation and linearity, in accordance with one implementation of the present application.

FIG. 2F, for example, illustrates the etching through the base oxide layer to an underlying handle wafer portion of action 350 as applied to SOI structure 200 wherein the hardmask (not shown) used to define narrow openings 212 may also be used to selectively etch a narrow opening 218 through remaining portions of base oxide layer 204 at the bottom of each of trenches 210a and 210b using an anisotropic dry etch process. In one implementation, narrow opening 212 and narrow opening 218 may have a width narrower than width $w_t$ of trench 210a, for example.

Figure 2G:
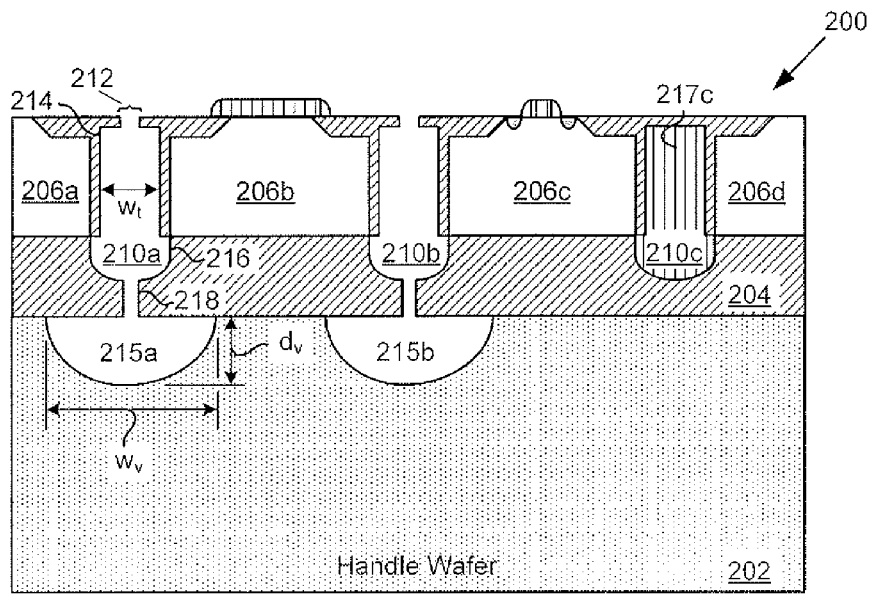
FIG. 2G illustrates an exemplary cross-sectional view of an SOI structure during fabrication in accordance with one implementation of the present application.

Continuing with action 360 of flowchart 300, action 360 includes etching a portion of the handle wafer beneath the trench so as to create a void in the handle wafer to improve electrical signal isolation between the adjacent devices situated in the top semiconductor layer. FIG. 2G, for example, illustrates such an action applied to SOI structure 200 where an isotropic etch may be used to remove a portion of handle wafer 202 beneath each of trenches 210a and 210b, creating voids 215a and 215b. Voids 215a and 215b may each have width $w_v$ of between 20 µm and 30 µm and depth $d_v$ having substantially the same dimension. However, width $w_v$ and depth $d_v$ of voids 215a and 215b may be chosen to be greater than or less than this range to suit the specific needs of a particular application. In one implementation, width $w_v$ of voids 215a and 215b may be greater than trench width $w_t$ of trenches 210a and 210b, respectively.

Figure 2H:
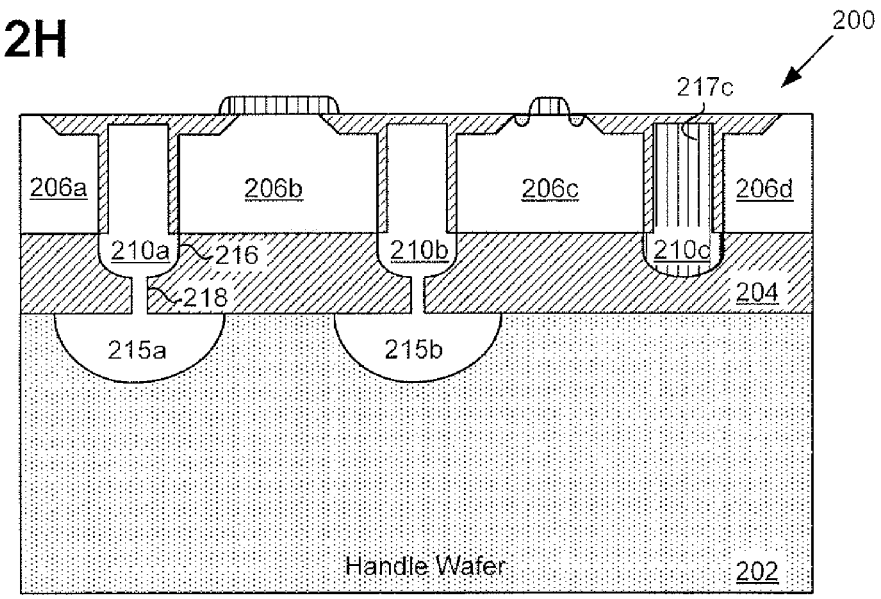
FIG. 2H illustrates an exemplary cross-sectional view of an SOI structure during fabrication in accordance with one implementation of the present application.

Finally, the width of narrow openings 212 to trenches 210a-b may be chosen such that a subsequent dielectric or oxide deposition used for a CMOS pre-metal dielectric, for example, effectively pinches off and seals trenches 210a and 210b when applied after a final handle wafer removal action. Thus, allowing industry-standard chemical-mechanical polishing to be employed in a final planarization action. FIG. 2H, for example, illustrates such a dielectric deposition and subsequent planarization as applied to SOI structure 200.

Figure 4:
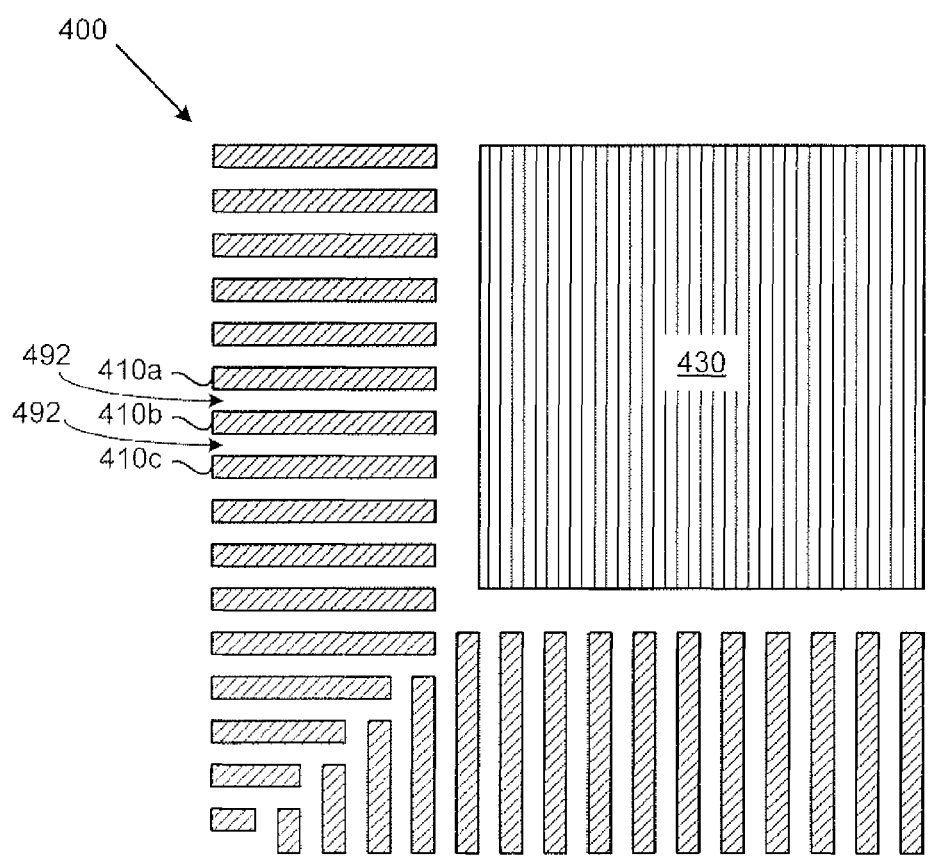
FIG. 4 illustrates an exemplary top view of an SOI structure for improving electrical signal isolation and linearity, in accordance with one implementation of the present application.

FIG. 4 shows an exemplary top view of trench array 400, which may correspond to the SOI structure of FIG. 2H. FIG. 4 illustrates how isolating trenches, such as trenches 410a-c, which may correspond to trenches 210a-c of FIGS. 2A-214 for example, may be formed perpendicular to the periphery of isolated device 430. The spaces between adjacent trenches, for example, spaces 492, may provide mechanical support for the entire trench array 400 and isolated device 430. In addition, though FIG. 4 and FIGS. 2A-2H may be drawn to the same implementation, isolated device 430 does not necessarily directly correspond to either of gates 220 or 230, but may have dimensions and relative placement different than those illustrated by FIGS. 2A-2H. Because mechanical stability and reliability concerns limit the use of a continuous gaps under the entire active device for applications such as RF switches, where large stacks of wide multi-gate devices are typically used, the above-described implementation of the present application allows for sufficient mechanical support of large active devices by leaving a contiguous and intact pedestal of the handle wafer under the active devices.

Thus, SOI structures for improving electrical signal isolation and linearity, according to one or more implementations of the present application, provide several advantages over conventional approaches. First, the dielectric isolation between adjacent active areas and the handle wafer is improved due to the increased separation between them, as well as the comparatively low dielectric constant of air ($\in$~1) in the voids as compared to silicon dioxide ($\in$~3.9) in the base oxide layer. The improved isolation may be attributed, in part, to the formation of the continuous cavity including the main body of each trench 210a-b and a respective underlying void 215a-b, connected to one another by opening 218. Second, any inversion layer induced by charges on the bottom surface of base oxide 204 will be of higher resistivity due to the increased path length between adjacent devices provided by the perimeter of voids 215a and 215b. Third, because voids 215a and 215b may extend beneath portions of one or more active devices in top semiconductor layer 206a-d, passive components such as metal-insulator-metal (MIM) capacitors and inductors formed in backend process over regions where handle wafer 202 has been partially removed will show higher Quality ("Q") factors. Finally, unetched portions of handle wafer 202 adjacent to voids 215a and 215b may also provide mechanical support to the top semiconductor layer 206.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for improving electrical signal isolation between adjacent devices situated in a top semiconductor layer, said method comprising:
    etching a trench through said top semiconductor layer and partially into a base oxide layer below said top semiconductor layer;
    depositing a polysilicon filler into said trench;
    removing said polysilicon filler and etching through said base oxide layer to an underlying handle wafer;
    etching a portion of said handle wafer beneath said trench so as to create a void in said handle wafer to improve electrical signal isolation between said adjacent devices situated in said top semiconductor layer.

2. The method of claim 1, wherein said void has a void width greater than a trench width of said trench.

3. The method of claim 1, wherein said void extends beneath a portion of one or more of said adjacent devices on said top semiconductor layer.

4. The method of claim 1, wherein said etching a portion of said handle wafer preserves unetched portions of said handle wafer to provide mechanical support to said top semiconductor layer.

5. The method of claim 1, wherein said etching a portion of said handle wafer is performed isotropically.

6. The method of claim 1, further comprising growing a liner oxide on a portion of a sidewall of said trench before said depositing said polysilicon filler into said trench.

7. The method of claim 1, further comprising growing an oxide layer over said polysilicon filler after said depositing said polysilicon filler into said trench.

8. The method of claim 1, further comprising depositing an oxide over a top opening of said trench to pinch off a cavity formed by said trench and said void.

9. A method comprising:
    etching a trench through a top semiconductor layer;
    depositing a polysilicon filler into said trench;
    removing said polysilicon filler and etching though a base oxide layer below said top semiconductor layer;
    etching a portion of a handle wafer beneath said trench so as to create a void in said handle wafer.

10. The method of claim 9, wherein said void has a void width greater than a trench width of said trench.

11. The method of claim 9, wherein said void extends beneath a portion of one or more devices on said top semiconductor layer.

12. The method of claim 9, wherein said etching a portion of said handle wafer preserves unetched portions of said handle wafer to provide mechanical support to said top semiconductor layer.

13. The method of claim 9, wherein said etching said portion of said handle wafer is performed isotropically.

14. The method of claim 9, further comprising growing a liner oxide on a portion of a sidewall of said trench before said depositing said polysilicon filler into said trench.

15. The method of claim 9, further comprising depositing an oxide over a top opening of said trench to pinch off a cavity formed by said trench and said void.

16. A method comprising:
    etching a trench through a top semiconductor layer;
    depositing a polysilicon filler into said trench;
    removing said polysilicon filler and etching below said top semiconductor layer;
    etching beneath said trench so as to create a void that extends beneath a portion of one or more devices on said top semiconductor layer.

17. The method of claim 16, wherein said void has a void width greater than a trench width of said trench.

18. The method of claim 16, wherein said etching beneath said trench is performed isotropically.

19. The method of claim 16, further comprising growing a liner oxide on a portion of a sidewall of said trench before said depositing said polysilicon filler into said trench.

20. The method of claim 16, further comprising depositing an oxide over a top opening of said trench to pinch off a cavity formed by said trench and said void.

* * * * *